(12) United States Patent
Chen et al.

(10) Patent No.: US 10,048,938 B2
(45) Date of Patent: Aug. 14, 2018

(54) ARITHMETIC CONTROL DEVICE, MEMORY SYSTEM INCLUDING THE SAME, INFORMATION PROCESSING DEVICE, AND ARITHMETIC CONTROL METHOD

(71) Applicant: TOSHIBA MEMORY CORPORATION, Tokyo (JP)

(72) Inventors: Jiezhi Chen, Kanagawa (JP); Kazuya Matsuzawa, Kanagawa (JP); Takao Marukame, Tokyo (JP); Yuuichiro Mitani, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 48 days.

(21) Appl. No.: 15/252,982

(22) Filed: Aug. 31, 2016

(65) Prior Publication Data
US 2016/0371057 A1   Dec. 22, 2016

Related U.S. Application Data

(63) Continuation of application No. PCT/JP2014/079988, filed on Nov. 12, 2014.

(30) Foreign Application Priority Data

Mar. 4, 2014   (JP) .................................. 2014-041854

(51) Int. Cl.
| | | |
|---|---|---|
| *G06F 7/50* | (2006.01) | |
| *G11C 11/56* | (2006.01) | |
| *G11C 16/04* | (2006.01) | |

(52) U.S. Cl.
CPC ............ *G06F 7/50* (2013.01); *G11C 11/5628* (2013.01); *G11C 11/5642* (2013.01); *G11C 16/0483* (2013.01)

(58) Field of Classification Search
CPC .... G06F 7/50; G11C 11/5628; G11C 11/5642
(Continued)

(56) References Cited

U.S. PATENT DOCUMENTS

2003/0183871 A1   10/2003   Dugger et al.
2006/0028247 A1   2/2006   Hara et al.
(Continued)

FOREIGN PATENT DOCUMENTS

| JP | 2005-522071 | 7/2005 |
|---|---|---|
| JP | 2006-48298 | 2/2006 |

(Continued)

OTHER PUBLICATIONS

Written Opinion of the International Searching Authority, issued by the Japanese Patent Office in International Application No. PCT/JP2014/079988, dated Dec. 16, 2014 (6 pages).
(Continued)

*Primary Examiner* — Tan V. Mai
(74) *Attorney, Agent, or Firm* — Finnegan, Henderson, Farabow, Garrett & Dunner, L.L.P.

(57) ABSTRACT

An arithmetic control device according to an embodiment controls arithmetic operations using a memory chip. The memory chip includes a memory cell array and a controller. The memory cell array includes a plurality of memory cells. The controller is configured to control access to the memory cell array. The arithmetic control device includes a first writing unit and a first reading unit. The first writing unit requests the controller to write a first value to a second cell near a first cell of the memory cell array. The first reading unit requests the controller to read a second value from the first cell after the first value is written to the second cell.

9 Claims, 11 Drawing Sheets

(58) Field of Classification Search
USPC .......................................................... 708/670
See application file for complete search history.

(56) References Cited

U.S. PATENT DOCUMENTS

| | | |
|---|---|---|
| 2006/0120162 A1 | 6/2006 | Fujiu et al. |
| 2008/0055979 A1 | 3/2008 | Shim |
| 2014/0146607 A1 | 5/2014 | Nagai et al. |
| 2015/0078100 A1* | 3/2015 | Nakayama ............. G11C 16/26 |
| | | 365/185.29 |

FOREIGN PATENT DOCUMENTS

| | | |
|---|---|---|
| JP | 2006-228394 | 8/2006 |
| JP | 2008-65979 | 3/2008 |
| JP | 2012-252195 | 12/2012 |
| JP | 2013-65374 | 4/2013 |
| JP | 5212143 | 6/2013 |

OTHER PUBLICATIONS

International Search Report issued by the Japanese Patent Office in International Application No. PCT/JP2014/079988, dated Dec. 16, 2014 (1 page).

* cited by examiner

ARITHMETIC CONTROL DEVICE, MEMORY SYSTEM INCLUDING THE SAME, INFORMATION PROCESSING DEVICE, AND ARITHMETIC CONTROL METHOD

CROSS-REFERENCE TO RELATED APPLICATIONS

This application is a continuation of PCT international application Ser. No. PCT/JP2014/079988 filed on Nov. 12, 2014 which designates the United States, and which claims the benefit of priority from Japanese Patent Application No. 2014-041854, filed on Mar. 4, 2014; the entire contents of which are incorporated herein by reference.

FIELD

Embodiments described herein relate generally to an arithmetic control device, a memory system including the same, an information processing device, and an arithmetic control method.

BACKGROUND

Recently, a market has drastically expanded for a lightweight, high-speed, low-power consuming, and large-capacity nonvolatile memory system along with development of a semiconductor miniaturization technology. For a large-capacity memory system, needs for development to functions other than data recording are becoming extremely important. Conventional data arithmetic operations have been basically executed by a dedicated arithmetic operation machine such as central processing unit (CPU) through software, for example, and a memory has been used for simple data recording and reading other than data arithmetic operations.

DETAILED DESCRIPTION

According to an embodiment, an arithmetic control device controls arithmetic operations using a memory chip. The memory chip includes a memory cell array and a controller. The memory cell array includes a plurality of memory cells. The controller is configured to control access to the memory cell array. The arithmetic control device includes a first writing unit and a first reading unit. The first writing unit requests the controller to write a first value to a second cell near a first cell of the memory cell array. The first reading unit requests the controller to read a second value from the first cell after the first value is written to the second cell.

An arithmetic control device according to embodiments exemplarily described with reference to the accompanying drawings, and a memory system including the same, and an arithmetic control method will be described in detail below.

First Embodiment

The following first describes an arithmetic control device according to the first embodiment, a memory system including the same, an information processing device, and an arithmetic control method in detail with reference to the drawings. The memory system exemplarily described in the first embodiment is a self arithmetic memory system that achieves an arithmetic operation function using an inter-cell interference effect of a memory chip. Specifically, writing of data to a cell shifts a threshold distribution of a memory cell (hereinafter simply referred to as a cell) adjacent to the cell. Thus, an arithmetic equation using a correlation between a threshold level of a first cell and the shift of a threshold distribution of a second cell can be achieved by designing a sequence of a writing operation on a group of adjacent cells. The first cell and the second cell may be each a single cell or one of a plurality of cells. When the first and the second cells are each one of a plurality of cells, they may be a group of cells arranged on word lines adjacent to each other, a group of cells arranged on bit lines adjacent to each other, or a group of cells included in a particular range as a divided planar region.

Figure 1:
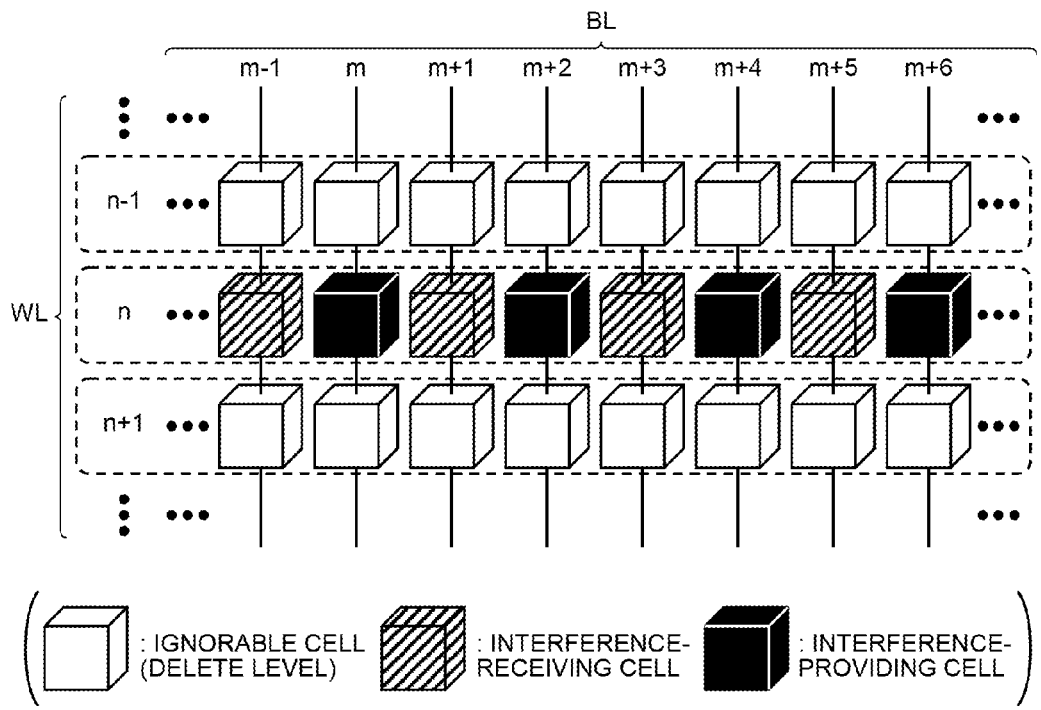
FIG. 1 is a pattern diagram illustrating an inter-cell interference effect between cells on an identical word line in a nonvolatile memory chip according to a first embodiment.

The following first describes a mechanism of a self arithmetic operation function according to the first embodiment in detail with reference to the drawings. FIG. 1 is a pattern diagram illustrating the inter-cell interference effect between cells on an identical word line in a nonvolatile memory chip. For example, when writing is performed on a cell (second cell) that is not near a cell (first cell) in the memory chip, the inter-cell interference effect can be ignored. In contrast, when writing is performed to the second cell that is near the first cell, the inter-cell interference occurs with the first cell serving as a cell that receives the interference (hereinafter referred to as an interference-receiving cell (victim cell)), and the second cell serving as a cell that provides the interference (hereinafter referred to as an interference-providing cell (attacker cell)). As a result, a threshold voltage value of the first cell (interference-receiving cell) shifts. For example, as illustrated in FIG. 1, when writing is performed only to cells (first cells) at odd-number array positions (for example, cross points with bit lines BL(m−1), (m+1), (m+3), and (m+5)) on an identical word line WL(n), the inter-cell interference effect is negligible. In contrast, when writing is performed to cells (second cells) at even-number array positions (for example, cross points with each of bit lines BL(m), (m+2), (m+4), and (m+6)) in addition to the first cells at the odd-number array positions, the second cells at the even-number array positions serve as interference-providing cells, shifting the thresholds of the first cells (interference-receiving cells) at the odd-number array positions.

Figure 2:
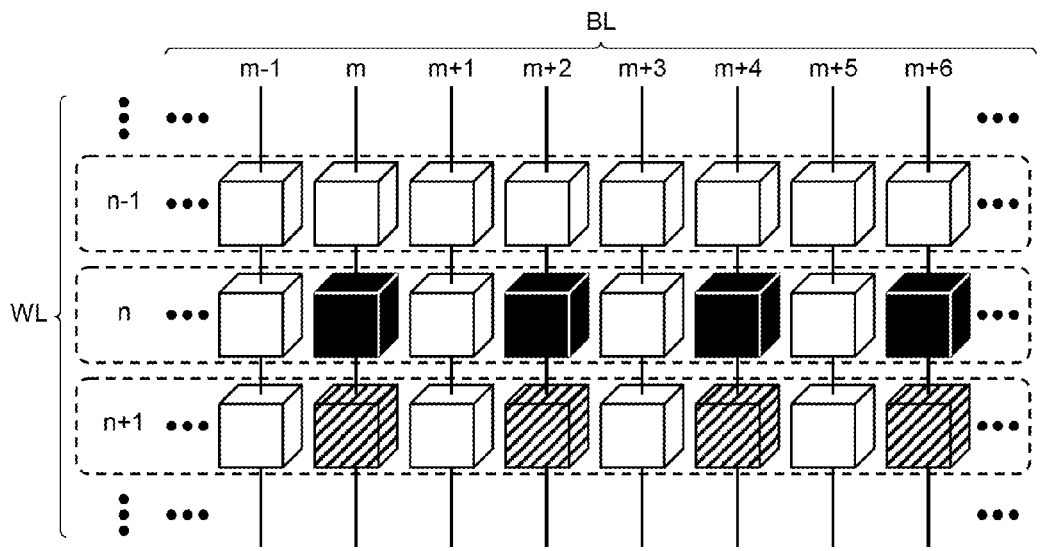
FIG. 2 is a pattern diagram illustrating the inter-cell interference effect between different word lines in the nonvolatile memory chip according to the first embodiment.

FIG. 2 is a pattern diagram illustrating the inter-cell interference effect between different word lines in a nonvolatile memory chip. FIG. 2 illustrates an example in which writing is performed only to cells at odd-number array positions on each word line to remove the inter-cell interference effect on an identical word line from consideration. Similarly, in a case of near cells on different word lines as illustrated in FIG. 2, for example, when writing is performed to, in addition to cells (first cells) on a word line WL(n), cells (second cells) on a word line WL(n+1) near the first cell, the second cells on the word line WL(n+1) serve as interference-providing cells, shifting the thresholds of the first cells (interference-receiving cells) on the word line WL(n).

Figure 3:
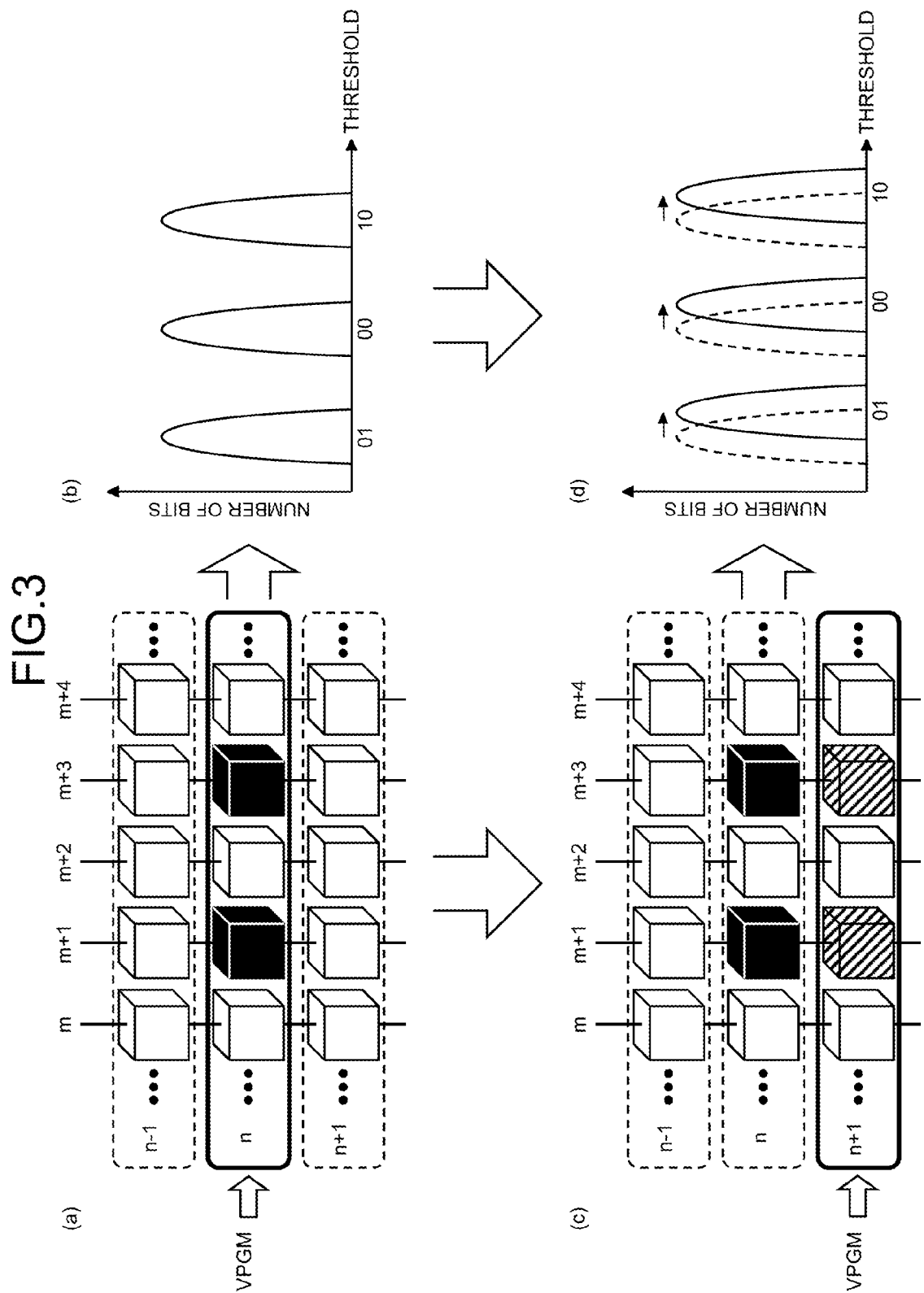
FIG. 3 is a pattern diagram illustrating shift of threshold distributions due to the inter-cell interference effect between different word lines in the nonvolatile memory chip according to the first embodiment.

Next, the shift of a threshold distribution due to the inter-cell interference effect between different word lines will be described in detail with reference to drawings. FIG. 3 is a pattern diagram illustrating the shift of threshold distributions due to the inter-cell interference effect between different word lines in a nonvolatile memory chip. A graph of (b) in FIG. 3 indicates threshold distributions extracted from cells on which writing is performed when writing is performed on cells that are not adjacent to each other on the word line WL(n) (for example, cells (first cells) at odd-number array positions) as illustrated in a diagram of (a) in FIG. 3 after data of all cells is first deleted. Then, when writing is performed on cells (second cells) that are adjacent to the first cells on the word line WL(n+1) that are adjacent to the word line WL(n) as illustrated in a diagram of (c) in FIG. 3, the threshold distributions of the first cells serving as interference-receiving cells are entirely shifted toward higher thresholds as illustrated in a graph of (d) in FIG. 3. The amount of this shift can be controlled by designing of an operation sequence at writing.

Figure 4:
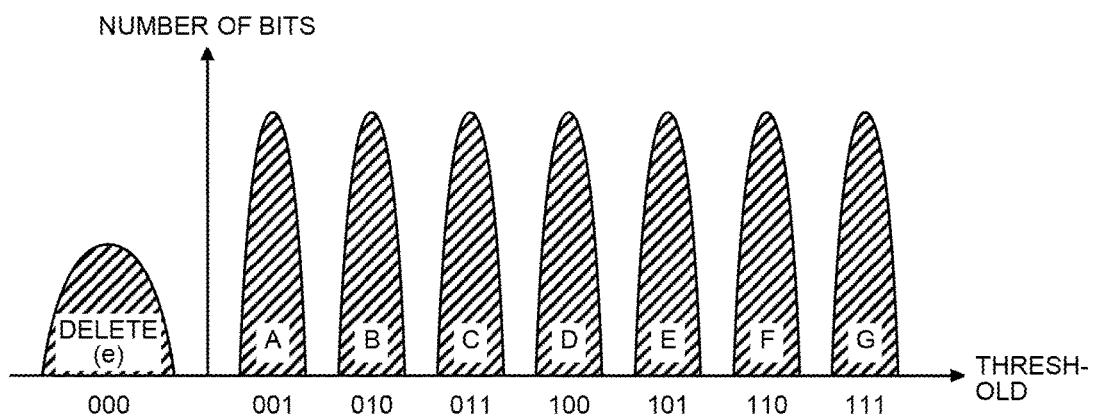
FIG. 4 is a pattern diagram illustrating threshold distributions of a cell that operates in three bits in the first embodiment.

FIG. 4 is a pattern diagram illustrating threshold distributions of a cell that operates in three bits. As illustrated in FIG. 4, the threshold distribution of this three-bit cell can be divided into eight distributions. These distributions can be defined as Delete (e) level, A level, B level, C level, D level, E level, F level, and G level in accordance with, for example, bit values. For improvement of arithmetic operation accuracy, only part of the eight levels may be used. For example, the four levels of A level, C level, E level, and G level are used for arithmetic operations. This allows allocation of a larger margin for each level, thereby improving the arithmetic operation accuracy.

Figure 5:
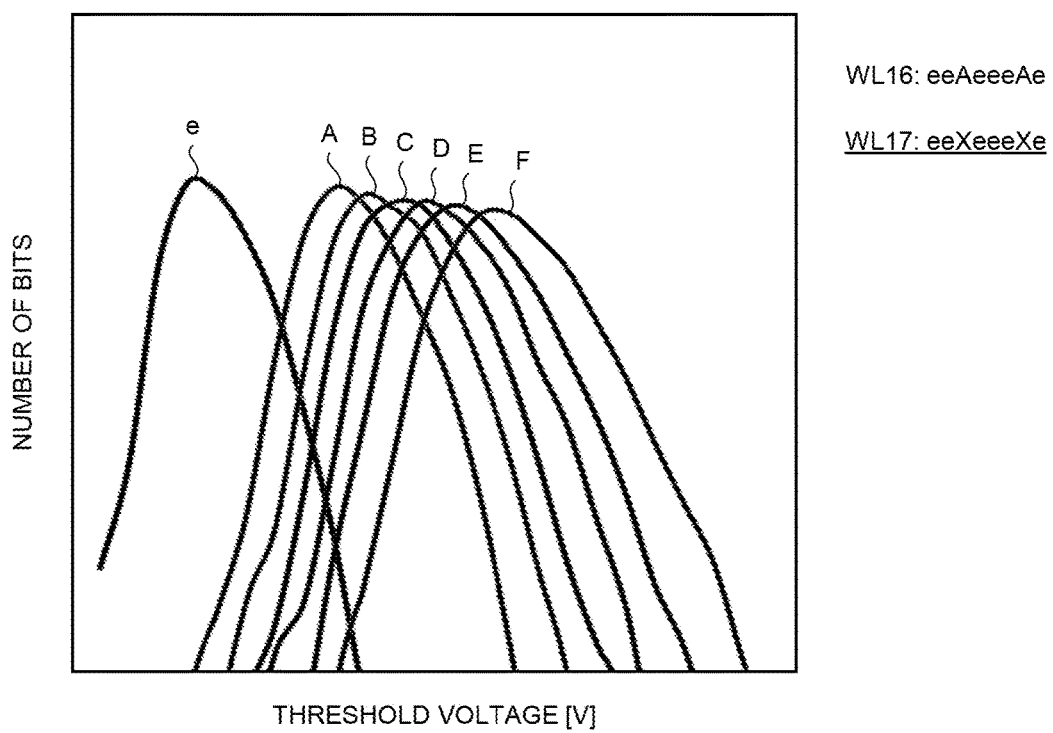
FIG. 5 is a graph illustrating measured data of threshold distributions of a first cell that shift in accordance with bit values written to second cells serving as interference-providing cells for the first cells (interference-receiving cells) on a word line in the first embodiment.

FIG. 5 is a graph illustrating measured data of the threshold distributions of the first cell that shift in accordance with bit values written to the second cells (cells on a word line WL17) serving as interference-providing cells for the first cells (interference-receiving cells) on a word line (word line WL16). Each piece of measured data illustrated in FIG. 5 is an average value of the number of bits of each first cell (interference-receiving cell) on the word line WL16 obtained through an operation sequence in which, first, data is deleted from all cells, then a specific pattern (interference-receiving pattern) {eeAeeeAe} is written to the word line WL16, and thereafter a specific pattern (interference-providing pattern) {eeXeeeXe} is written to the word line WL17. However, the measured data is not limited to the average value, and may be a statistic of values obtained by executing a plurality of arithmetic operations, or may be a value of a single cell In FIG. 5, the first cells (interference-receiving cell) on the word line WL16 are cells to which A level is written. In FIG. 5, "e" represents Delete level, and "A" to "F" represent A level to F level, respectively. In addition, "X" is a variable for specifying Delete level "e" to G level.

As illustrated in FIG. 5, for example, when data (A) of one Byte is written to a word line, this data (A) of one Byte is converted into pieces of data (specific pattern {eeAeeeAe}) of one word line that is repeated with an ignorable cell at Delete level on one word line interposed therebetween. A result of writing this data {eeAeeeAe} to the word line WL16 changes with the shift of threshold distributions depending on a value (X) written to interference-providing cells on the word line WL17.

Figure 6:
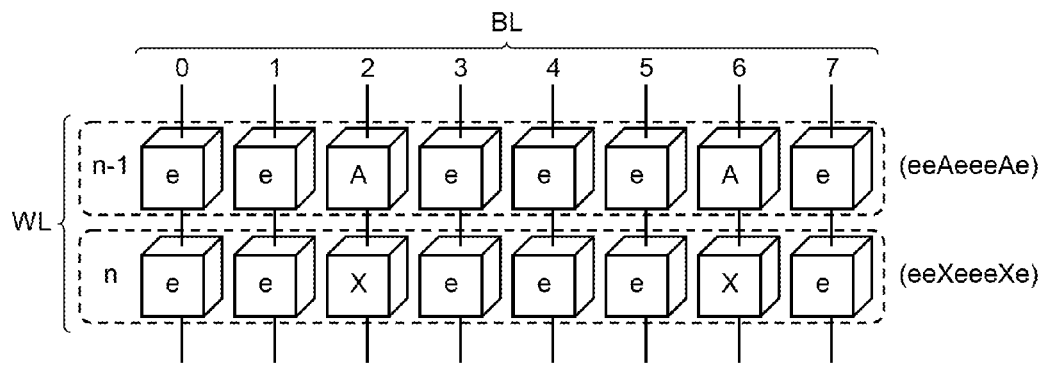
FIG. 6 is a diagram illustrating a first example of an interference pattern exemplarily described in the first embodiment.
Figure 7:
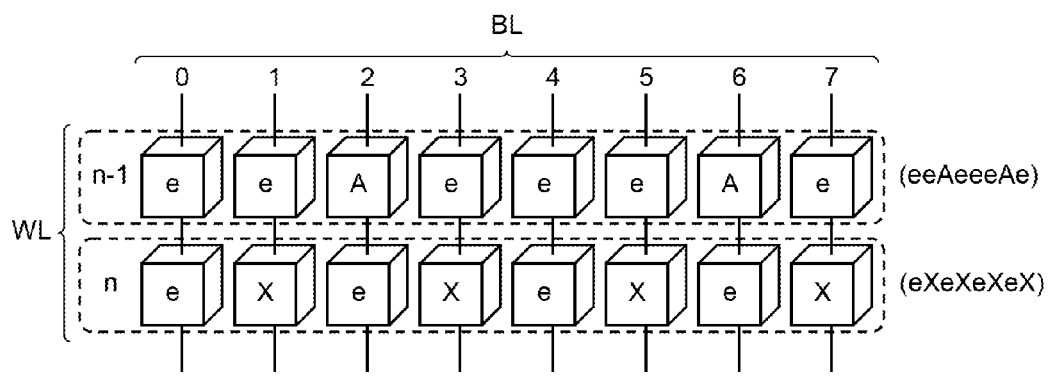
FIG. 7 is a diagram illustrating a second example of the interference pattern exemplarily described in the first embodiment.
Figure 8:
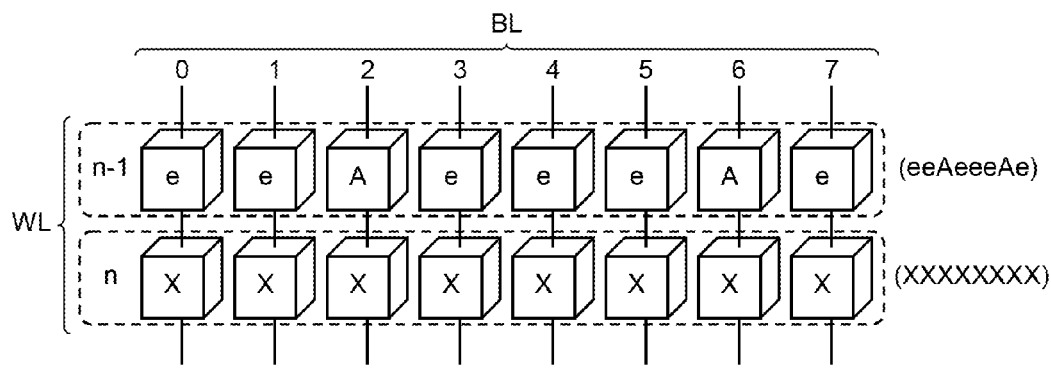
FIG. 8 is a diagram illustrating a third example of the interference pattern exemplarily described in the first embodiment.
Figure 9:
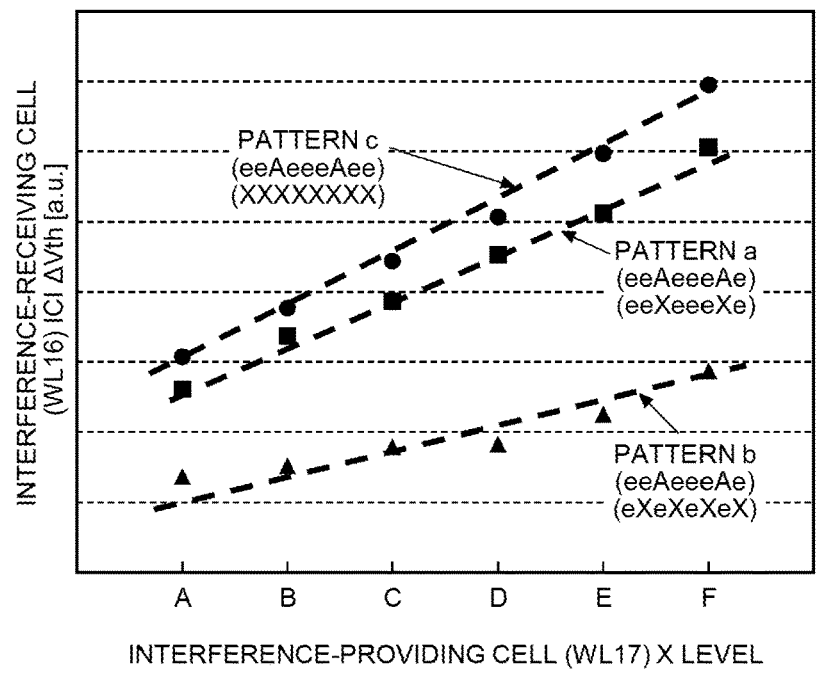
FIG. 9 is a graph illustrating measured results of the inter-cell interference effect obtained with the interference-providing patterns in FIGS. 6 to 8.

The following describes the inter-cell interference effect that changes in accordance with an allocation pattern (interference-providing pattern) of interference-providing cells (second cells) on word lines. FIGS. 6 to 8 illustrate examples of the interference pattern exemplarily described in the first embodiment. FIG. 9 is a graph illustrating measured results of the inter-cell interference effect obtained with the interference-providing patterns in FIGS. 6 to 8. In FIGS. 6 to 8, an identical specific pattern {eeAeeeAe} is used as an allocation pattern (interference-receiving pattern) of interference-receiving cells (first cells) on a word line. FIGS. 6 to 8 illustrate an example in which an interference-providing pattern is written to one word line (referred to as an interference-providing word line) adjacent to a word line (referred to as an interference-receiving word line) to which an interference-receiving pattern is written.

FIG. 6 illustrates an example in which an interference-providing pattern a of {eeXeeeXe} in which a cell (referred to as a first nearest cell) nearest to each interference-receiving cell (cell to which A is written in the interference-receiving pattern {eeAeeeAe}) serves as an interference-providing cell is written to an interference-providing word line. FIG. 7 illustrates an example in which an interference-providing pattern b of {eXeXeXeX} in which two cells (referred to as second nearest cells) adjacent to the first nearest cell on the interference-providing word line serve as interference-providing cells is written. FIG. 8 illustrates an example in which an interference-providing pattern c of {XXXXXXXX} in which all cells on the interference-providing word line serve as interference-providing cells is written.

As illustrated in FIG. 9, for all the interference-providing patterns a to c, increasing the value X of an interference-providing cell can increase the amount of shift of the threshold distribution of the interference-receiving cell. Among the interference-providing patterns a to c illustrated in FIGS. 6 to 8, the amount of shift of the threshold distribution is relatively large for the interference-providing patterns a and c as compared to the interference-providing pattern b. This may be because influence provided by the first nearest cell on the interference-receiving cell is extremely larger than influence provided by the second nearest cell. Among the interference-providing patterns a to c, the amount of shift of the threshold distribution is largest for the interference-providing pattern c in which all cells serve as interference-providing cells.

Figure 10:
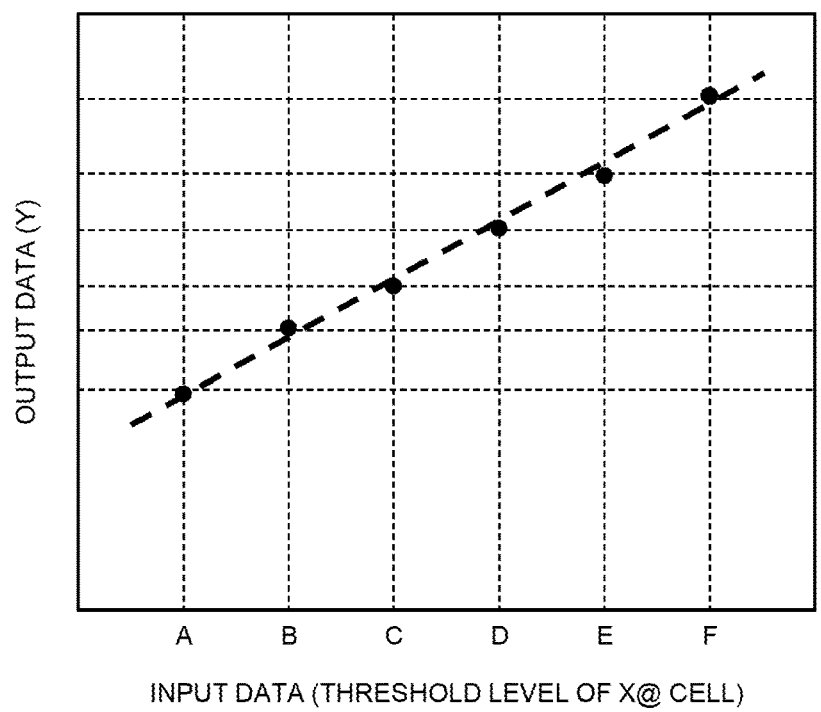
FIG. 10 is a graph illustrating a relation between input data and output data in arithmetic operations using inter-cell interference according to the first embodiment.

FIG. 10 is a graph illustrating a relation between input data and output data in arithmetic operations using the inter-cell interference. In FIG. 10, the input data is interference-providing data {eeXeeeXe}, and the output data is values read from an interference-receiving word line after the input data is written to the interference-providing word line. As illustrated in FIG. 10, when the threshold distribution or a threshold shift amount (Y) is read from an interference-receiving word line (for example, the word line WL(n)) after the value X in the interference-providing data {eeXeeeXe} is written as the input data to an interference-providing word line (for example, the word line WL(n+1)), a result (Y) is the same as an arithmetic operation result obtained by Expression (1) below. In Expression (1) below, a and b are constant.

$$Y = aX + b \tag{1}$$

In this manner, the output data (Y) has a dependency on the input data (X), and thus, obtaining the parameters a and b in advance enables a self arithmetic memory chip including an arithmetic operation function to be achieved.

Figure 11:
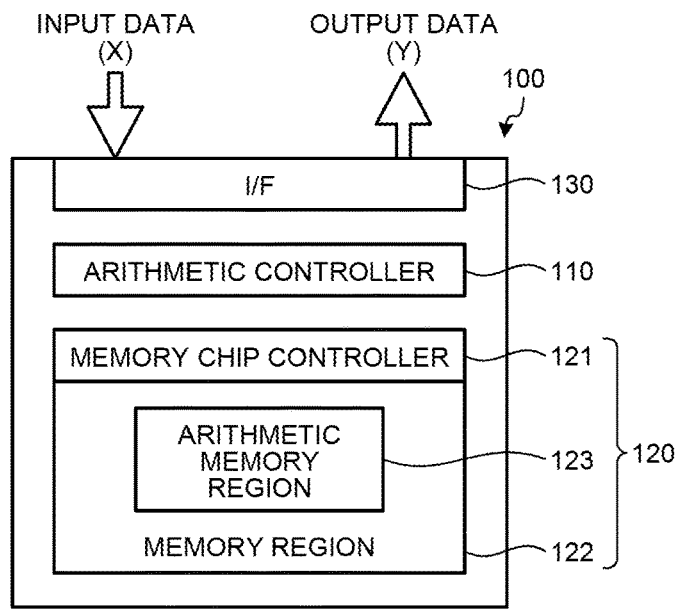
FIG. 11 is a schematic configuration diagram illustrating an exemplary memory system including a self arithmetic memory chip according to the first embodiment.

The following describes the memory system including a self arithmetic memory chip according to the first embodiment in detail with reference to the accompanying drawings. FIG. 11 is a schematic configuration diagram illustrating an exemplary memory system including the self arithmetic memory chip according to the first embodiment. As illustrated in FIG. 11, a memory system 100 includes an arithmetic controller 110, a memory chip 120, and a data input-output interface 130. The memory chip 120 includes a memory region 122 that includes a memory cell array in which a plurality of cells are two-dimensionally arranged, and a memory chip controller 121 that controls access to the memory region 122. In FIG. 11, the memory region 122 includes an arithmetic memory region 123, but the present invention is not limited thereto, and the memory region 122 does not need to be divided into the arithmetic memory region 123 and a normal memory region.

When an input data (X) is input, the arithmetic controller 110 executes specification of arithmetic operation data (hereinafter referred to as arithmetic equation data (F)), allocation of a data address used in arithmetic operations, and selection of an arithmetic operation writing operation sequence (hereinafter referred to as an arithmetic operation sequence). These pieces of information are transmitted from the arithmetic controller 110 to the memory chip controller 121. The data address used in arithmetic operations includes, for example, specification of an address region (hereinafter, an interference-receiving word line) in which the arithmetic equation data (F) is stored, and specification of an address region (hereinafter, an interference-providing word line) in which the input data (X) is stored.

The memory chip controller 121 stores, in accordance with an input arithmetic operation sequence, the arithmetic equation data (F) input from the arithmetic controller 110 in the interference-receiving word line in the arithmetic memory region 123, and then stores the input data (X) in the interference-providing word line in the arithmetic memory region 123, and thereafter reads values from the interference-receiving word line as the output data (Y). Accordingly, the output data (Y) as a result calculated with the arithmetic equation data (F) is obtained.

When the arithmetic equation data (F) to be used is predetermined, this arithmetic equation data (F) may be stored in the interference-receiving word line in advance. In this case, the arithmetic controller 110 only needs to execute the allocation of an address region (interference-providing word line) in which the input data (X) is stored and the selection of the arithmetic operation sequence. The memory chip controller 121 directly inputs, in accordance with an input arithmetic operation sequence, the input data (X) into an interference-providing word line, and then reads values from the interference-receiving word line in which the arithmetic equation data (F) is stored, thereby obtaining the output data (Y) as a result of arithmetic operations with the arithmetic equation data (F).

Figure 12:
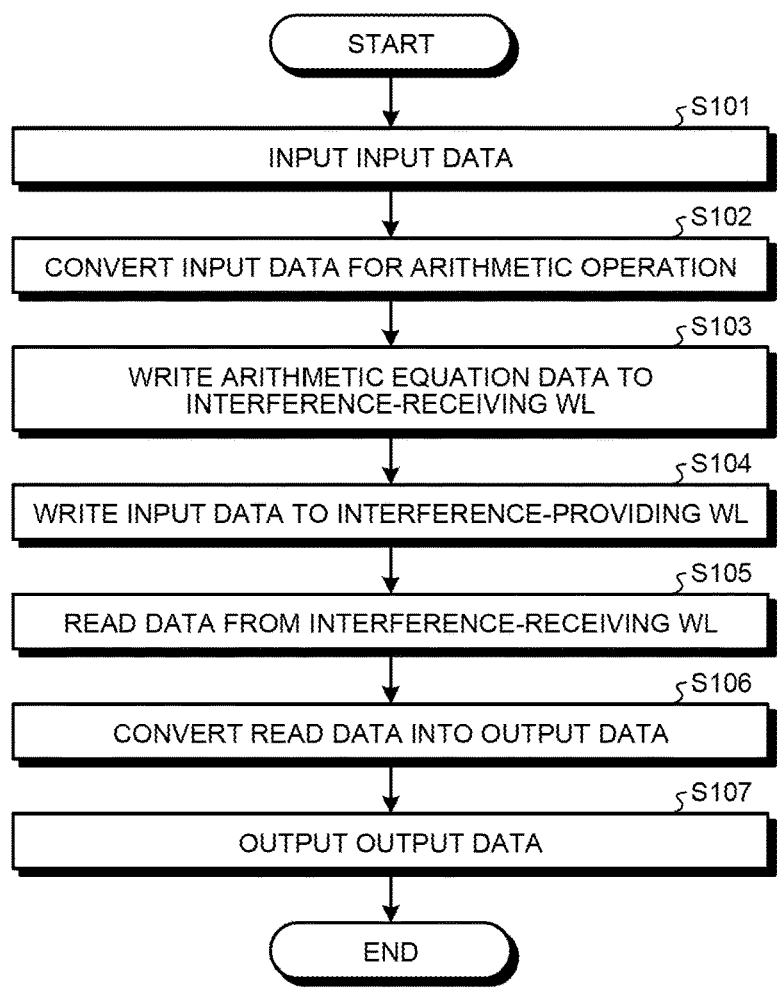
FIG. 12 is a flowchart of an exemplary arithmetic operation according to the first embodiment.

FIG. 12 is a flowchart of an exemplary arithmetic operation according to the first embodiment. As illustrated in FIG. 12, in the arithmetic operation according to the first embodiment, when the input data (X) is first input through the interface 130 (step S101), the arithmetic controller 110 converts the input data (X) into arithmetic operation data (X) (step S102). The arithmetic operation data (X) may be, for example, a specific pattern of {eeXeeeXe}, {eXeXeXeX}, or {XXXXXXXX}. If an operation sequence, a data address, and a data conversion rule for data recording are different from an operation sequence (the arithmetic operation sequence), a data address, and a data conversion rule for arithmetic operations, the arithmetic controller 110 may determine the arithmetic operation sequence, the data address, and the data conversion rule for arithmetic operations. If the arithmetic equation data (F) used in arithmetic operations is not determined in advance, the arithmetic controller 110 may specify or select the arithmetic equation data (F) to be used in arithmetic operations.

Subsequently, the memory chip controller 121 writes the arithmetic equation data (F) input from the arithmetic controller 110 to the interference-receiving word line (step S103), and then writes the arithmetic operation input data (X) to an interference-providing word line (step S104). Thereafter, the memory chip controller 121 reads values from the interference-receiving word line as output data (Y) (step S105). The output data (Y) read at step S105 is data in a specific pattern such as {eeYeeeYe}. Thus, the arithmetic controller 110 converts the read output data (Y) into output data (Y) in a pattern that allows processing (step S106), and then outputs this converted output data (Y) through the interface 130 (step S107), which ends the present operation.

Figure 13:
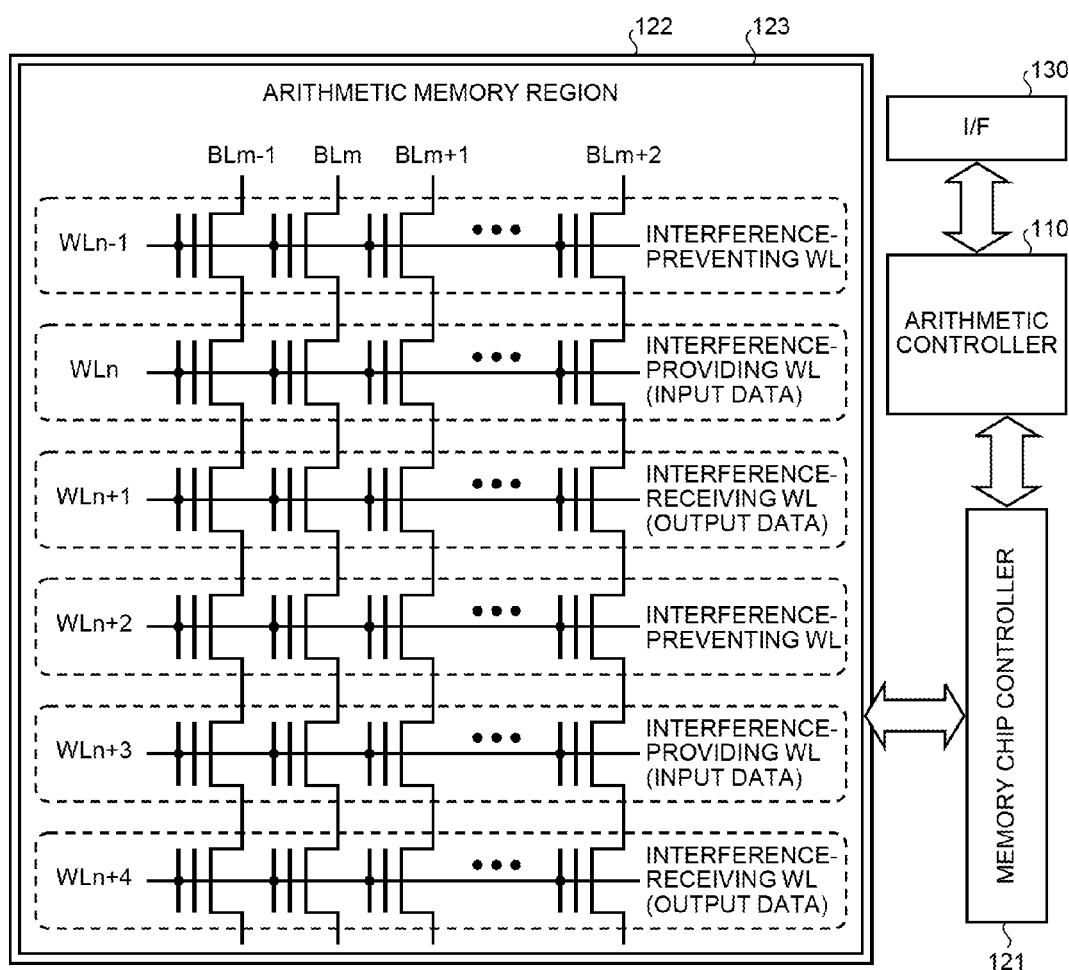
FIG. 13 is a pattern diagram illustrating a first usage example of an arithmetic memory region in the first embodiment.
Figure 14:
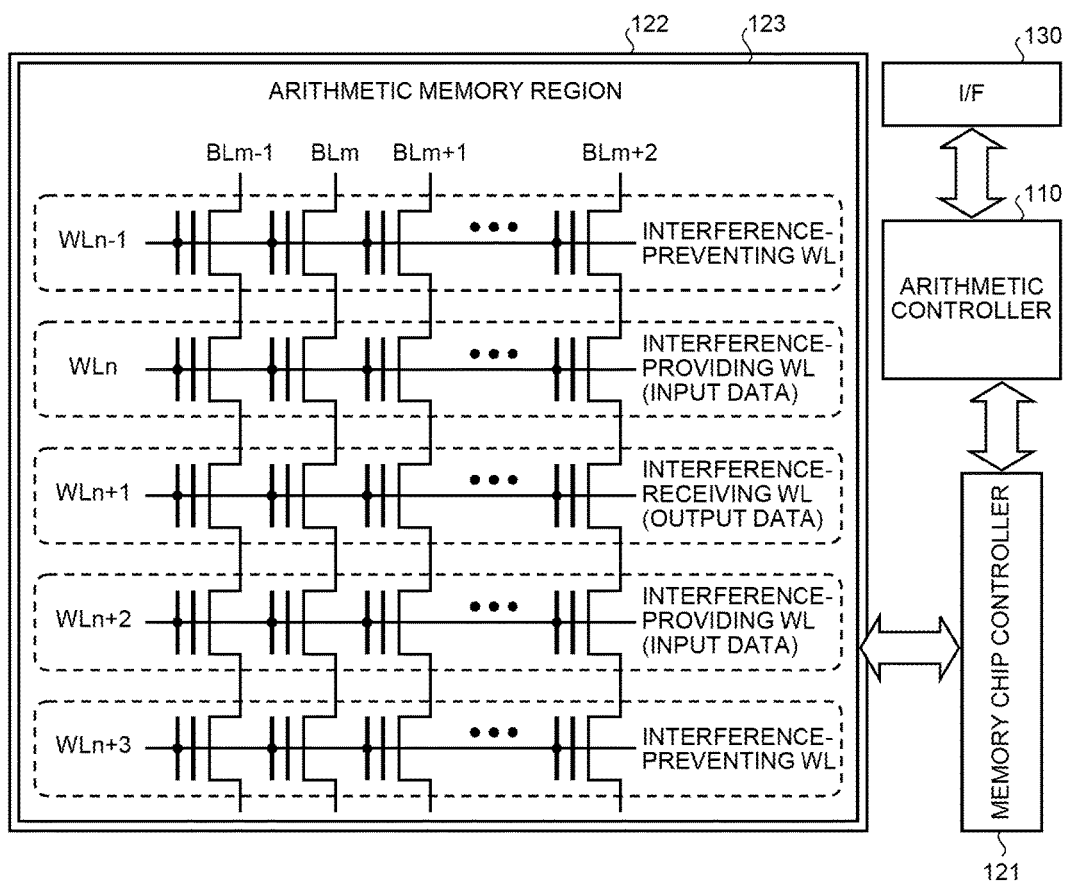
FIG. 14 is a pattern diagram illustrating a second usage example of the arithmetic memory region in the first embodiment.
Figure 15:
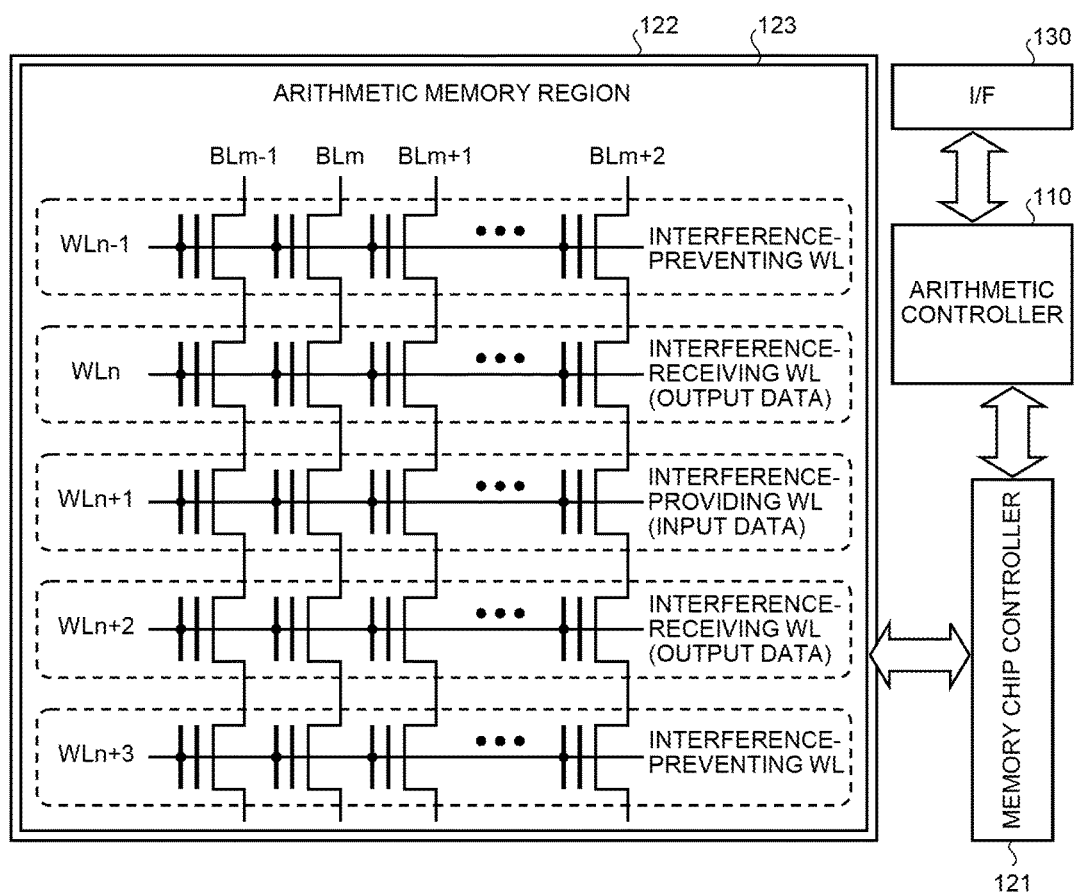
FIG. 15 is a pattern diagram illustrating a third usage example of the arithmetic memory region in the first embodiment.

The following describes a usage example of the arithmetic memory region with reference to a specific example. FIGS. 13 to 15 are each a pattern diagram illustrating a usage example of part of the arithmetic memory region in the first embodiment. In the examples illustrated in FIGS. 13 to 15, word lines in the arithmetic memory region 123 are classified into three kinds in accordance with their roles. Specifically, word lines in the arithmetic memory region 123 include an arithmetic operation result reading interference-receiving word line (output data), and an input-data writing interference-providing word line (input data). These interference-receiving and interference-providing word lines may be adjacent to each other. In order to prevent undesired inter-cell interference, an interference-preventing word line may be arranged between a pair of the interference-receiving word line and the interference-providing word line. The interference-preventing word line may be a word line on which an ignorable cell at what is called the Delete level is arranged for preventing generation of the inter-cell interference between a cell on the interference-receiving word line and a cell on the interference-providing word line that is not paired with the cell on the interference-receiving word line.

In the example illustrated in FIG. 13, the interference-preventing word line, the interference-receiving word line, and the interference-providing word line are arranged in this order repeatedly for the number of times equal to or larger than one. The interference-receiving word line and the interference-providing word line may be arranged in the opposite order.

In an arithmetic operation sequence in the example illustrated in FIG. 13, first, all cells in a block (in this example, a pair of the interference-receiving word line and the interference-providing word line) that is divided by the interference-preventing word lines are deleted. Then, the arithmetic equation data (F) specified by the arithmetic controller 110 is written to the interference-receiving word line. For example, if a specific pattern {eAeAeAeA} is selected as the arithmetic equation data (F), A level is written to cells (for example, cells at cross points with bit lines BL(m), BL(m+2), . . . ) at odd-number positions on the interference-receiving word line WL(n+1) or WL (n+4). Subsequently, the input data (X) input through the interface 130 is written to the interference-providing word line WL(n) or WL(n+3). Accordingly, the threshold distributions of cells (first cells) on the interference-receiving word line WL(n+1) or WL(n+4) shift under the inter-cell interference. Thereafter, values are read from the interference-receiving word line WL(n+1) or WL(n+4) as the output data (Y).

In the example illustrated in FIG. 14, one interference-receiving word line is sandwiched between two interference-providing word lines. Such an arrangement enables further complicated combinations of arithmetic equations. For example, an arithmetic equation with two or more pieces of data to be input, such as Expression (2) below, can be achieved. Expression (2) below has two pieces of data to be input, X1 and X2. In this case, for example, the input data (X1) is written to the interference-providing word line WL(n) in FIG. 14, and the input data (X2) is written to the interference-providing word line WL(n+2). Thereafter, values are read from the interference-receiving word line WL(n+1), thereby acquiring the output data (Y) as an arithmetic operation result of Expression (2).

$$Y = aX1 + bX2 \quad (2)$$

In the example illustrated in FIG. 15, one interference-providing word line is sandwiched between two interference-receiving word lines. Such an arrangement enables simultaneous execution of two arithmetic operations. For example, as in Expressions (3) and (4) below, two arithmetic operations can be simultaneously executed for one piece of input data (X). In Expressions (3) and (4) below, arithmetic operation data (F) is Y1 and Y2. In this case, for example, arithmetic operation data (F1) is written to the interference-receiving word line WL(n) in FIG. 15, and arithmetic operation data (F2) is written to the interference-receiving word line WL(n+2). Thereafter, the input data (X) is written to the interference-providing word line WL(n+1), and then values are read from the interference-receiving word lines WL(n) and WL(n+1), thereby acquiring output data (Y1) and (Y2) as arithmetic operation results of Expressions (3) and (4).

$$Y1 = aX \quad (3)$$

$$Y2 = bX \quad (4)$$

As exemplarily illustrated in FIGS. 13 to 15, interference-receiving word lines and interference-providing word lines can be arranged as appropriate to achieve various combinations of arithmetic equations.

Figure 16:
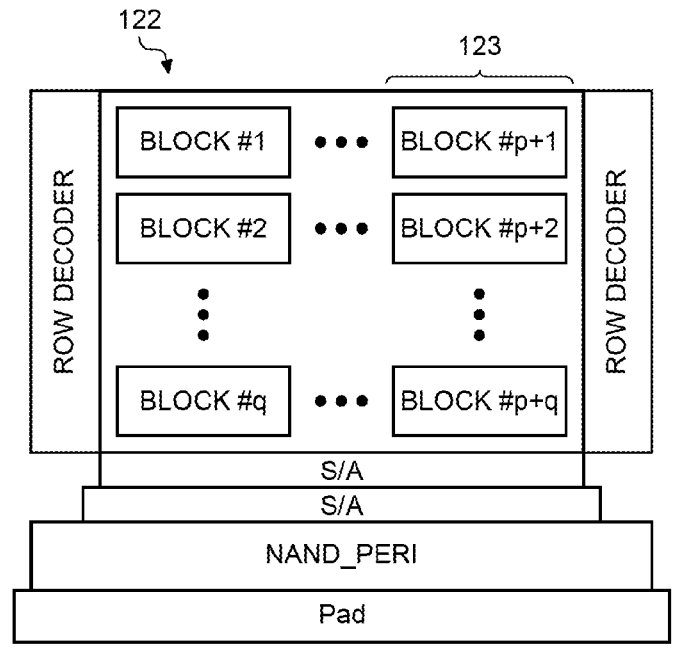
FIG. 16 is a pattern diagram illustrating an exemplary arrangement of the arithmetic memory region in a memory region in the first embodiment.

FIG. 16 illustrates allocation of the arithmetic memory region 123 in the memory region 122 of the memory chip 120. As illustrated in FIG. 16, one memory region 122 is divided into a plurality of blocks #1 to #p+q. With this configuration, some (for example, blocks #p+1 to #p+q) of the blocks #1 to #p+q may be used as the arithmetic memory region 123. Alternatively, a partial memory region connected with a particular word line or bit line in one or a plurality of blocks may be used as the arithmetic memory region 123, and thus division between a data storage memory region and the arithmetic memory region 123 can be optionally set. For example, the arithmetic controller 110 and the memory chip controller 121 may be configured to automatically set the arithmetic memory region 123 depending on a use condition and the like.

Figure 17:
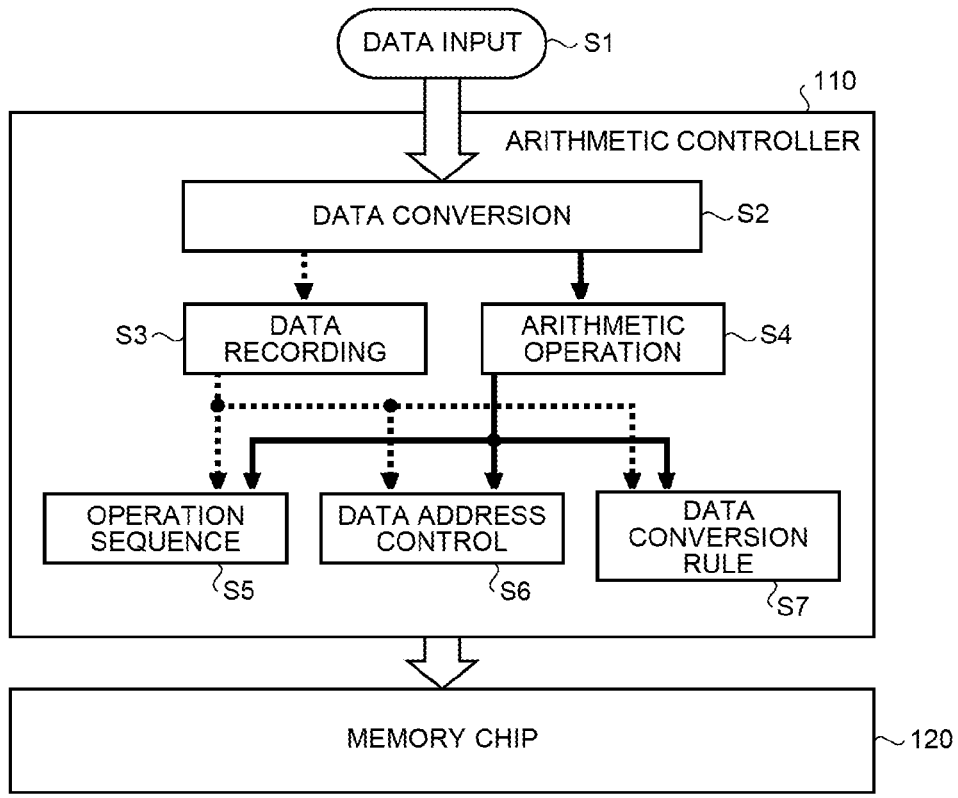
FIG. 17 is a conceptual diagram illustrating an exemplary operation sequence as a mixture of data storage and arithmetic processing in the first embodiment.

The following describes an operation sequence as a mixture of data storage and arithmetic processing in detail with reference to drawings. FIG. 17 is a conceptual diagram illustrating an exemplary operation sequence as a mixture of data storage and arithmetic processing. In a case of the mixture of data storage and arithmetic processing, it is assumed that the operation sequence, the data address, and the data conversion rule for data recording are different from the operation sequence, the data address, and the data conversion rule for arithmetic operations. In such a case, data recording processing and arithmetic processing need to be separately controlled. In the example illustrated in FIG. 17, upon data input (S1), the arithmetic controller 110 performs data conversion of the input data (X) (S2) and then executes one or both of data recording (S3) and arithmetic operations (S4) of the converted input data (X). Accordingly, the operation sequence, the data address, and the data conversion rule for each of these operations are determined and input to the memory chip controller 121 in the memory chip 120. The arithmetic controller 110 may specify one or both of the data recording and the data arithmetic operations to be executed by the memory chip controller 121.

As described above, according to the first embodiment, using the inter-cell interference effect of the memory chip enables a correlation between the threshold level of an interference-providing word line and the shift of the threshold distribution of an interference-receiving word line to be expressed in an arithmetic equation that follows a certain writing operation sequence. As a result, the memory system including the self arithmetic operation function can be achieved.

Second Embodiment

The following describes an arithmetic control device according to the second embodiment, a memory system including the same, an information processing device, and an arithmetic control method in detail with reference to the drawings. The second embodiment describes an exemplary information processing device on which the memory system 100 including the self arithmetic operation function exemplarily illustrated in the first embodiment is mounted.

Figure 18:
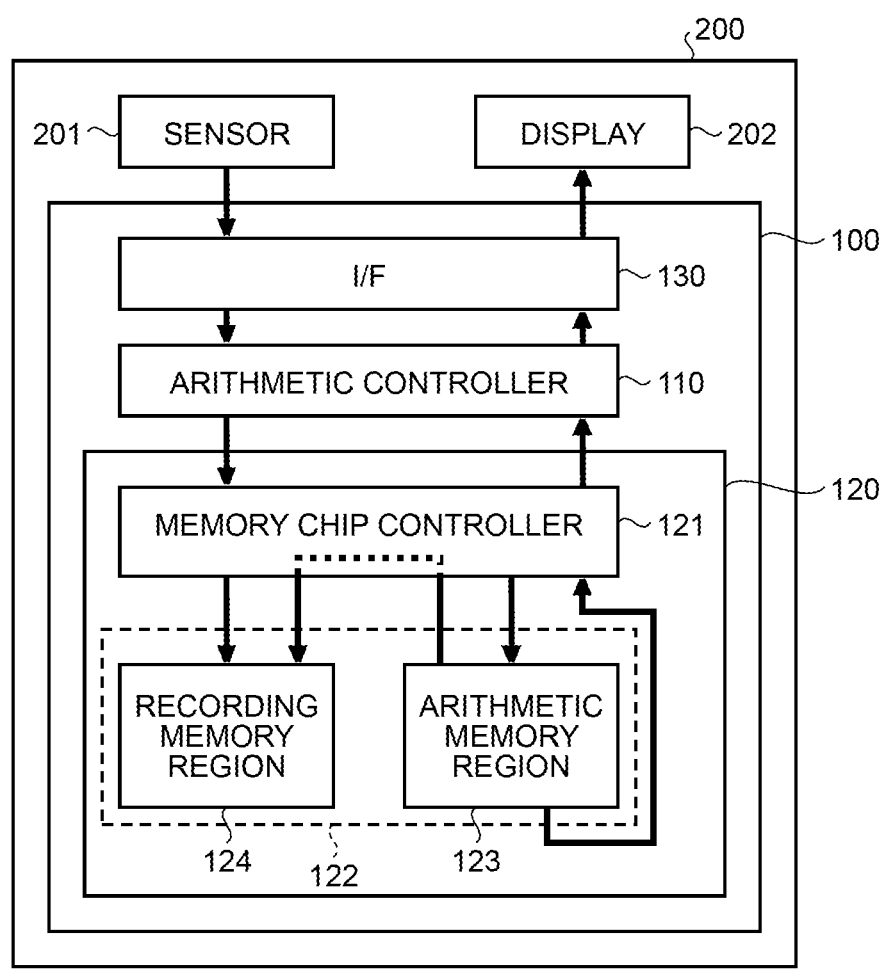
FIG. 18 is a schematic configuration diagram illustrating an exemplary information processing device according to a second embodiment.

FIG. 18 is a schematic configuration diagram illustrating an exemplary information processing device according to the second embodiment. An information processing device 200 illustrated in FIG. 18 is an information processing device capable of performing arithmetic operations (prediction) using the self arithmetic operation function of the memory chip 120 in addition to data recording on the memory chip 120. As illustrated in FIG. 18, the information processing device 200 includes a sensor 201 and a display 202 in addition to the memory system 100 according to the first embodiment. A recording memory region 124 may be a region other than the arithmetic memory region 123 in the memory region 122 in the first embodiment.

In FIG. 18, the sensor 201 may be various kinds of sensors such as a temperature/humidity sensor, a pH sensor, a position sensor, an acceleration sensor, a blood pressure sensor, and a blood sugar level sensor. A detection result obtained by the sensor 201 is input as the input data (X) to the arithmetic controller 110 through the interface 130. The arithmetic controller 110 executes, in accordance with, for example, the same operation sequence as the operation sequence described with reference to FIG. 17 in the first embodiment, data recording onto the recording memory region 124 and arithmetic operations with the input data (X).

An arithmetic operation result (the output data (Y)) read from the arithmetic memory region 123 may be stored in the recording memory region 124 through the memory chip controller 121, or may be output through the interface 130 and displayed on the display 202. The storage and display of the arithmetic operation result may be set by a user through an input unit that is not illustrated.

As described above, according to the second embodiment, various information processing devices including various self arithmetic operation functions can be achieved by using the memory system 100 according to the first embodiment. For example, when the sensor 201 is a blood sugar level sensor, a small blood sugar level prediction device having a fast arithmetic operation speed can be achieved.

It is clear from the above description that the above-described embodiments and modifications are merely examples for achieving the present invention, and the present invention is not limited to these embodiments and modifications, and various kinds of changes can be performed in accordance with specifications and the like within the scope of the present invention, and other various kinds of embodiments are possible within the scope of the present invention. For example, any modification exemplarily illustrated as appropriate for the embodiments can be combined with other embodiments.

What is claimed is:

1. An arithmetic control device configured to control arithmetic operations using a memory chip that includes a memory cell array including a plurality of memory cells, and includes a controller configured to control access to the memory cell array, the arithmetic control device comprising:
   a first writing unit configured to request the controller to write a first value to a second cell near a first cell of the memory cell array;
   a first reading unit configured to request the controller to read a second value from the first cell after the first value is written to the second cell;
   a first conversion unit configured to convert input data from outside into the first value; and
   a second conversion unit configured to convert the second value read by the first reading unit.

2. The arithmetic control device according to claim 1, wherein
   the first cell is at least one memory cell connected with a first wire,
   the second cell is at least one memory cell connected with a second wire adjacent to the first wire,
   the first writing unit requests writing of the first value wire by wire, and
   the first reading unit requests reading of the second value wire by wire.

3. The arithmetic control device according to claim 2, wherein
   the second wire includes two wires adjacent to the first wire so as to sandwich the first wire, and
   the first writing unit includes a second writing unit configured to request to write the first value to one of the two second wires, and a third writing unit configured to request to write a third value identical to or different from the first value to the other of the two second wires.

4. The arithmetic control device according to claim 2, wherein
   the first wire includes two wires adjacent to the second wire so as to sandwich the second wire, and
   the first reading unit includes a second reading unit configured to request to read the second value from one of the two first wires, and a third reading unit configured to request to read a third value from the other of the two first wires.

5. The arithmetic control device according to claim 2, wherein the first and the second wires are a word line or a bit line.

6. The arithmetic control device according to claim 1, further comprising a second writing unit configured to request the controller to write a third value to the first cell before the first value is written to the second cell.

7. The arithmetic control device according to claim 1, wherein the second cell is an adjacent cell positioned next to the first cell in the memory cell array or a nearest cell positioned next to the adjacent cell.

8. A memory system, comprising:
   the arithmetic control device according to claim 1;
   the memory chip; and
   an interface configured to externally input and output data.

9. An information processing device, comprising:
   the memory system according to claim 8;
   a sensor; and
   a display, wherein
   the sensor and the display are connected with the memory system through the interface, and
   the first writing unit requests the controller to write a detection result input from the sensor to the second cell as the first value.

* * * * *